(12) United States Patent
Tadjer et al.

(10) Patent No.: US 9,960,266 B2
(45) Date of Patent: May 1, 2018

(54) DAMAGE-FREE PLASMA-ENHANCED CVD PASSIVATION OF ALGAN/GAN HIGH ELECTRON MOBILITY TRANSISTORS

(71) Applicant: The United States of America, as represented by the Secretary of the Navy, Washington, DC (US)

(72) Inventors: Marko J. Tadjer, Springfield, VA (US); Andrew D. Koehler, Alexandria, VA (US); Travis J. Anderson, Alexandria, VA (US); Karl D. Hobart, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/592,248

(22) Filed: May 11, 2017

(65) Prior Publication Data

US 2017/0338332 A1    Nov. 23, 2017

Related U.S. Application Data

(60) Provisional application No. 62/337,463, filed on May 17, 2016.

(51) Int. Cl.
  *H01L 29/778* (2006.01)
  *H01L 21/02* (2006.01)
  (Continued)

(52) U.S. Cl.
  CPC ...... *H01L 29/7787* (2013.01); *H01L 21/0217* (2013.01); *H01L 21/0254* (2013.01);
  (Continued)

(58) Field of Classification Search
  CPC .......... H01L 29/66462; H01L 29/7787; H01L 29/7786; H01L 29/205; H01L 2924/13064;
  (Continued)

(56) References Cited

U.S. PATENT DOCUMENTS 9,202,880 B1 * 12/2015 Corrion ................ H01L 29/402
2001/0032986 A1    10/2001 Miyasaka
  (Continued)

OTHER PUBLICATIONS

Search Report and Written Opinion from Korean Intellectual Property Office in corresponding PCT Application No. PCT/US2017/032067.
  (Continued)

*Primary Examiner* — Tom Thomas
*Assistant Examiner* — Nilufa Rahim
(74) *Attorney, Agent, or Firm* — US Naval Research Laboratory; Joslyn Barritt

(57) ABSTRACT

Passivated AlGaN/GaN HEMTs having no plasma damage to the AlGaN surface and methods for making the same. In a first embodiment, a thin HF SiN barrier layer is deposited on the AlGaN surface after formation of the gate. A thick HF/LF SiN layer is then deposited, the thin HF SiN layer and the thick HF/LF Sin layer comprising bi-layer SiN passivation on the HEMT. In a second embodiment, a first thin HF SiN barrier layer is deposited on the AlGaN surface before formation of the gate and is annealed. Following annealing of the first SiN layer, the gate is formed, and a second HF SiN barrier layer is deposited, followed by a thick HF/LF SiN layer, the three SiN layers comprising tri-layer SiN passivation on the HEMT.

27 Claims, 8 Drawing Sheets

(51) Int. Cl.
*H01L 29/66* (2006.01)
*H01L 29/51* (2006.01)
*H01J 37/32* (2006.01)

(52) U.S. Cl.
CPC .. H01L 21/02274 (2013.01); H01L 21/02458 (2013.01); H01L 29/66462 (2013.01); *H01J 37/32091* (2013.01); *H01L 29/518* (2013.01)

(58) Field of Classification Search
CPC .......... H01L 21/02247; H01L 21/02315; H01J 37/32082
See application file for complete search history.

(56) References Cited

U.S. PATENT DOCUMENTS

| | | | |
|---|---|---|---|
| 2007/0018199 A1 | 1/2007 | Sheppard | |
| 2009/0146224 A1 | 6/2009 | Heying | |
| 2009/0315078 A1 | 12/2009 | Parikh | |
| 2013/0189854 A1* | 7/2013 | Hausmann | H01L 21/0217 438/792 |
| 2015/0145004 A1* | 5/2015 | Inoue | H01L 29/4236 257/192 |
| 2016/0005596 A1* | 1/2016 | Behera | H01L 21/02115 438/703 |

OTHER PUBLICATIONS

A.P. Edwards, J.A. Mittereder, S.C. Binari, D.S. Katzer, D.F. Storm, and J.A. Roussos, "Improved reliability of AlGaN—GaN HEMTs using an NH3 plasma treatment prior to SiN passivation," IEEE Electr. Dev. Lett., vol. 26, No. 4, pp. 225 (2005).

S.C. Binari, K. Ikossi, J.A. Roussos, W. Kruppa, D. Park, H.B. Dietrich, D.D. Koleske, A.E. Wickenden, and R.L. Henry, "Trapping Effects and Microwave Power Performance in AlGaN/GaN HEMTs," IEEE Trans. Electr. Dev., vol. 48, No. 3, pp. 465-471 (2001).

H. Kim, R.M. Thompson, V. Tilak, T.R. Prunty, J.R. Shealy, and L.F. Eastman, "Effects of SiN passivation and high-electric field on AlGaN—GaN HFET degradation," IEEE Electr. Dev. Lett., vol. 24, No. 7, pp. 421-423 (2003).

X. Wang, S. Huang, Y. Zheng, K. Wei, X. Chen, G. Liu, T. Yuan, W. Luo, L. Pang, H. Jiang, J. Li, C. Zhao, H. Zhang, and X. Liu, "Robust SiNx/AlGaN Interface in GaN HEMTs Passivated by Thick LPCVD-grown SiNx Layer," IEEE Electr. Dev. Lett., vol. 36, No. 7, pp. 666-668 (2015).

B.P. Downey, D.J. Meyer, D.S. Katzer, T.M. Marron, M. Pan, and X. Gao, "Effect of SiNx gate insulator thickness on electrical properties of SiNx/In0.17Al0.83N/AlN/GaN MIS—HEMTs," Solid State Electron., vol. 106, pp. 12-17 (2015).

M.J Tadjer, T.J. Anderson, K.D. Hobart, M.A. Mastro, J.K. Hite, J.D. Caldwell, Y.N. Picard, F.J. Kub, and C.R. Eddy, "Electrical and Optical Characterization of AlGaN/GaN HEMTs with In Situ and Ex Situ Deposited SiNx Layers," J. Electr. Mater., vol. 39, No. 11, pp. 2452-2458 (2010).

W.S. Tan, P.A. Houston, G. Hill, R.J. Airey, and P.J. Parbrook, "Influence of Dual-Frequency Plasma-Enhanced Chemical-Vapor Deposition Si3N4 Passivation on the Electrical Characteristics of AlGaN/GaN Heterostructure Field-Effect Transistors," J. Electr. Mater., vol. 33, No. 5, pp. 400 (2004).

G.N. Parsons, J.H. Souk, and J. Batey, "Low hydrogen content stoichiometric silicon nitride films deposited by plasma enhanced chemical vapor deposition," J. Appl. Phys. 70, 1553 (1991).

H. Huang, K.J. Winchester, A. Suvorova, B.R. Lawn, Y. Liu, X.Z. Hu, J.M. Dell, and L. Faraone, "Effect of deposition conditions on mechanical properties of low-temperature PECVD silicon nitride films," Mater. Sci. and Engineering A 435-436 (2006) 453-459.

D.J. Meyer, J.R. Flemish, and J.M. Redwing, "Plasma Surface Pretreatment Effects on Silicon Nitride Passivation of AlGaN/GaN HEMTs," CS Mantech Conf. Digest, pp. 305, 2007.

A.D. Koehler, N. Nepal, T.J. Anderson, M.J. Tadjer, K.D. Hobart, C.R. Eddy, Jr., and F.J. Kub, "Atomic Layer Epitaxy AlN for Enhanced AlGaN/GaN HEMT Passivation," IEEE Electr. Dev. Lett., vol. 34, No. 9, pp. 1115-1117 (2012).

S. Arulkumaran, T. Egawa, H. Ishikawa, T. Jimbo, and Y. Sano, "Surface passivation effects on AlGaN/GaN high-electron-mobility transistors with SiO2, Si3N4, and silicon oxynitride," Appl. Phys. Lett. vol. 84, No. 4, pp. 613-615 (2004).

J. Derluyn, S. Boeykens, K. Cheng, R. Vandersmissen, J. Das, W. Ruythooren, S. Degroote, M. R. Leys, M. Germain, and G. Borghs, "Improvement of AlGaN/GaN high electron mobility transistor structures by in situ deposition of a Si3N4 surface layer," J. Appl. Phys. 98, 054501 (2005).

C. Liu, E. F. Chor, and L.S. Tan, "Enhanced device performance of AlGaN/GaN HEMTs using HfO2 high-k dielectric for surface passivation and gate oxide," Semicond. Sci. Technol. 22 (2007) 522-527.

B. Luo, J. W. Johnson, J. Kim, R. M. Mehandru, F. Ren, B. P. Gila, A. H. Onstine, C. R. Abernathy, S. J.Pearton, A. G. Baca, R. D. Briggs, R. J. Shul, C. Monier, and J. Han, "Influence of MgO and Sc2O3 passivation on AlGaN/GaN high-electron-mobility transistors," Appl. Phys. Lett. vol. 80, No. 9, pp. 1661-1663 (2002).

\* cited by examiner

DAMAGE-FREE PLASMA-ENHANCED CVD PASSIVATION OF ALGAN/GAN HIGH ELECTRON MOBILITY TRANSISTORS

CROSS-REFERENCE

This Application is a Nonprovisional of and claims the benefit of priority under 35 § 119 based on U.S. Provisional Patent Application No. 62/337,463 filed on May 17, 2016. The Provisional Application and all references cited herein are hereby incorporated by reference into the present disclosure in their entirety.

TECHNICAL FIELD

The present invention relates to passivation of AlGaN/GaN high electron mobility transistors (HEMTs) by means of plasma-enhanced CVD (PECVD) SiN films, particularly to passivation of such HEMTs without plasma damage to the AlGaN surface from the PECVD process.

BACKGROUND

Gallium nitride (GaN)-based high electron mobility transistors (HEMTs) with a thin ternary or a quaternary barrier, particularly AlGaN/GaN HEMTs formed with aluminum gallium nitride (AlGaN), have found promising applications as high frequency, high electric field, high power devices. Such devices typically include an AlGaN barrier layer formed on a GaN channel/buffer layer, with a gate formed on an upper surface of the AlGaN layer. A two-dimensional (2D) electron gas is formed at the AlGaN/GaN interface due to tight quantum confinement of the density of states in the third dimension. This quantization of states at the interface effectively works as a two dimensional model of confined electrons. Electrons (or holes) can move with high mobility in the plane of the AlGaN/GaN interface, however, vertical motion is confined by the band structure of the heterojunction and can be ignored in practical applications.

One advantage of AlGaN/GaN HEMTs is the proximity of this 2D electron gas to the surface of the HEMT, which leads to a low contact resistance Ohmic contacts to the 2D electron channel. However, despite the proximity of this 2D electron gas to the surface, device reliability problems can arise when electrons can become trapped in surface defects, causing carrier scattering manifested by reduced output current, i.e., current collapse.

FIG. 2A illustrates the concept of quiescent bias well-known to those skilled in the art. The device is stressed at pre-determined values for the drain and gate voltage ($V_{GS,Q}$ and $V_{DS,Q}$), after which dynamic on resistance ($R_{ON,DYN}$) is measured before the quiescent bias conditions are applied again. This method provides device performance information under more realistic operating conditions. For example, FIG. 2B shows the reduction in output current, and corresponding increase in $R_{ON,DYN}$ for $V_{DS,Q}$ up to 50 V.

Carrier scattering in GaN-based HEMTs has been traditionally mitigated by means of a passivation dielectric such as SiN, AlN, SiON, $SiO_2$, MgO, $Sc_2O_3$, $HfO_2$ deposited on the upper surface of the HEMT. Of these methods, SiN passivation is most common. See A. P. Edwards, J. A. Mittereder, S. C. Binari, D. S. Katzer, D. F. Storm, and J. A. Roussos, "Improved reliability of AlGaN—GaN HEMTs using an NH3 plasma treatment prior to SiN passivation," IEEE Electr. Dev. Lett., Vol. 26, No. 4, pp. 225 (2005); S. C. Binari, K. Ikossi, J. A. Roussos, W. Kruppa, D. Park, H. B. Dietrich, D. D. Koleske, A. E. Wickenden, and R. L. Henry, "Trapping Effects and Microwave Power Performance in AlGaN/GaN HEMTs," IEEE Trans. Electr. Dev., Vol. 48, No. 3, pp. 465-471 (2001); H. Kim, R. M. Thompson, V. Tilak, T. R. Prunty, J. R. Shealy, and L. F. Eastman, "Effects of SiN passivation and high-electric field on AlGaN—GaN HFET degradation," IEEE Electr. Dev. Lett., Vol. 24, No. 7, pp. 421-423 (2003); and X. Wang, S. Huang, Y. Zheng, K. Wei, X. Chen, G. Liu, T. Yuan, W. Luo, L. Pang, H. Jiang, J. Li, C. Zhao, H. Zhang, and X. Liu, "Robust SiNx/AlGaN Interface in GaN HEMTs Passivated by Thick LPCVD-grown SiNx Layer," IEEE Electr. Dev. Lett., Vol. 36, No. 7, pp. 666-668 (2015).

Other methods for obtaining improved AlGaN/GaN HEMT surface passivation that have been used in the prior art include low pressure CVD (LPCVD) of SiN, see Wang et al., supra; molecular beam epitaxy (MBE), see B. P. Downey, et al., "Effect of SiNx gate insulator thickness on electrical properties of SiNx/In0.17Al0.83N/AlN/GaN MIS-HEMTs," Solid State Electron., Vol. 106, pp. 12-17 (2015); and metal organic CVD (MOCVD), see M. J Tadjer, et al., "Electrical and Optical Characterization of AlGaN/GaN HEMTs with In Situ and Ex Situ Deposited SiNx Layers," J. Electr. Mater., Vol. 39, No. 11, pp. 2452-2458 (2010).

Mixed-frequency plasma-enhanced CVD (PECVD) SiN deposition is another common method used for passivation of GaN-based HEMTs. A typical such passivated HEMT is shown in FIG. 1, and includes an AlGaN/GaN HEMT 101 having a gate 102 formed thereon, with a 100 nm-thick high-frequency/low-frequency SiN passivation layer deposited on the upper surface of the HEMT.

However, low-frequency plasma in mixed-frequency PECVD SiN deposition can introduce undesirable damage to the surface of the III-Nitride heterostructure and consequently degrade device performance. This plasma damage originates from the ion energy distribution function in a radio frequency (RF) generated plasma, which is frequency dependent. Specifically for PECVD, at a low-frequency (LF, 100-360 kHz) both electrons and ions are energized towards the GaN surface by the RF plasma, whereas the ion energies are much lower during high frequency (HF, 13.56 MHz) rf power. As a result, additional surface traps on the AlGaN surface can be created by ions energized from the LF plasma.

There have been attempts to address this problem of N ions bombarding the AlGaN surface during low frequency plasma deposition. See W. S. Tan and coworkers in 2004. See W. S. Tan, P. A. Houston, G. Hill, R. J. Airey, and P. J. Parbrook, "Influence of Dual-Frequency Plasma-Enhanced Chemical-Vapor Deposition Si3N4 Passivation on the Electrical Characteristics of AlGaN/GaN Heterostructure Field-Effect Transistors," J. Electr. Mater., Vol. 33, No. 5, pp. 400 (2004).

No methods to date have been able to achieve SiN passivation without damage to the HEMT surface.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides passivated AlGaN/GaN HEMTs having no plasma damage to the AlGaN surface and further provides methods for the deposition of plasma-enhanced CVD (PECVD) SiN films for passivation of AlGaN/GaN high electron mobility transistors (HEMTs) without LF-plasma ion damage to the AlGaN surface from the PECVD process.

In a first embodiment, the present invention suppresses the damage to the AlGaN surface by inserting a thin, typically about 10 nm, "barrier" SiN film grown by HF PECVD after formation of the gate but before the HF/LF plasma deposition of the thick SiN layer, the thin HF SiN layer and the thick HF/LF SiN layer comprising bi-layer SiN passivation on the plasma damage-free AlGaN surface of the HEMT device In a second embodiment, a first HF PECVD SiN layer is deposited on the upper surface of the AlGaN layer and is annealed before formation of the gate. Following the annealing of this first HF SiN layer, the gate is formed and a second HF PECVD SiN layer is deposited, followed by formation of a HF/LF PECVD SiN layer, the first HF SiN layer, the second HF SiN layer, and the third HF/LF SiN layer comprising tri-layer SiN passivation on the plasma damage-free AlGaN surface of the HEMT device.

DETAILED DESCRIPTION

Figure 1:
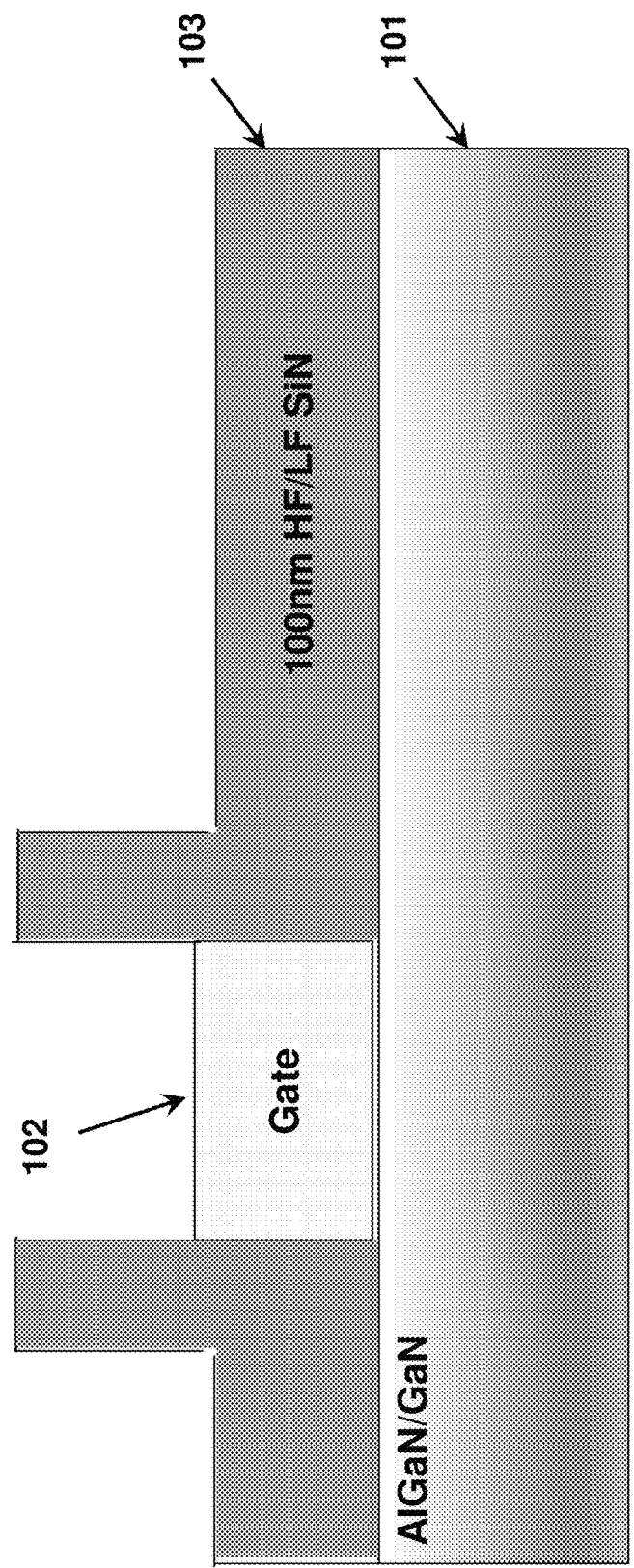
FIG. 1 is a block schematic illustrating aspects of an exemplary SiN-passivated HEMT in accordance with the prior art.
Figure 2A:
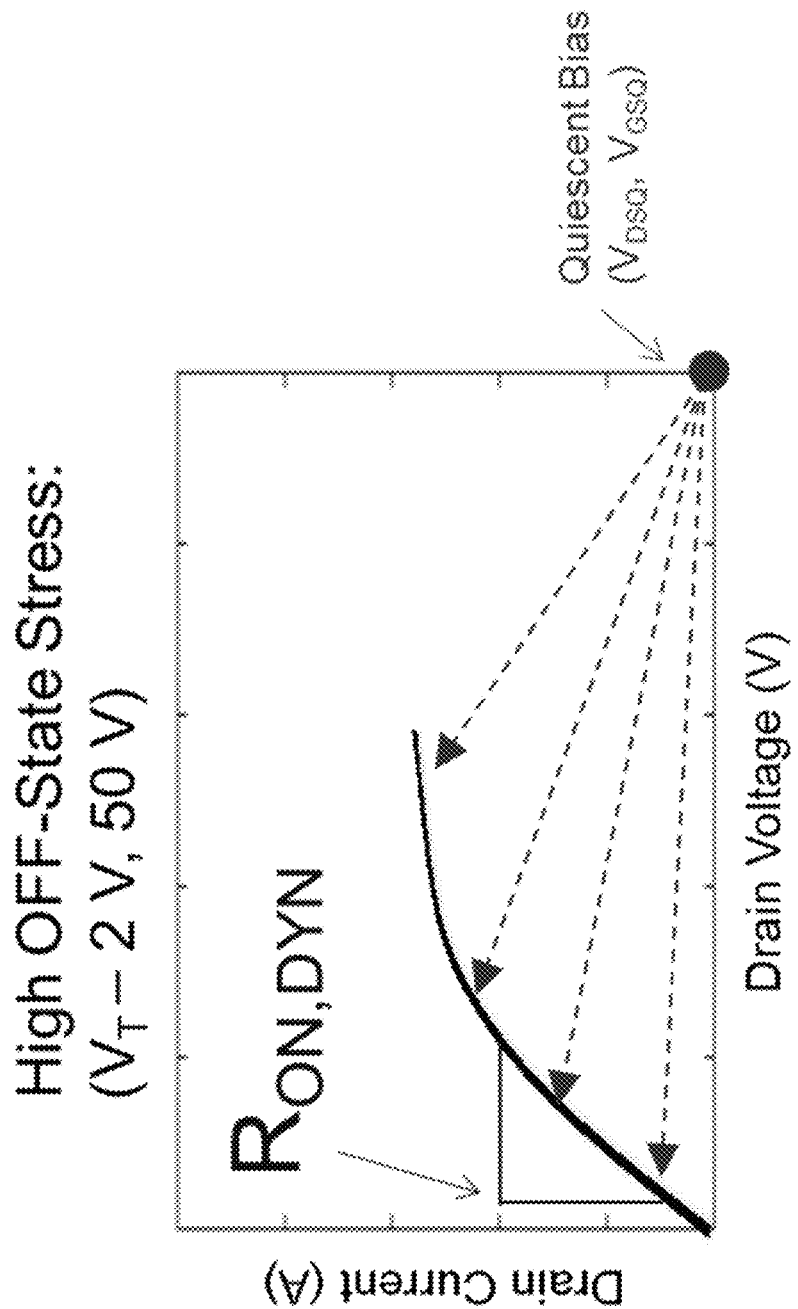
FIGS. 2A and 2B are plots illustrating aspects of current collapse in conventional unpassivated or poorly passivated HEMTs according to the prior art.
Figure 2B:
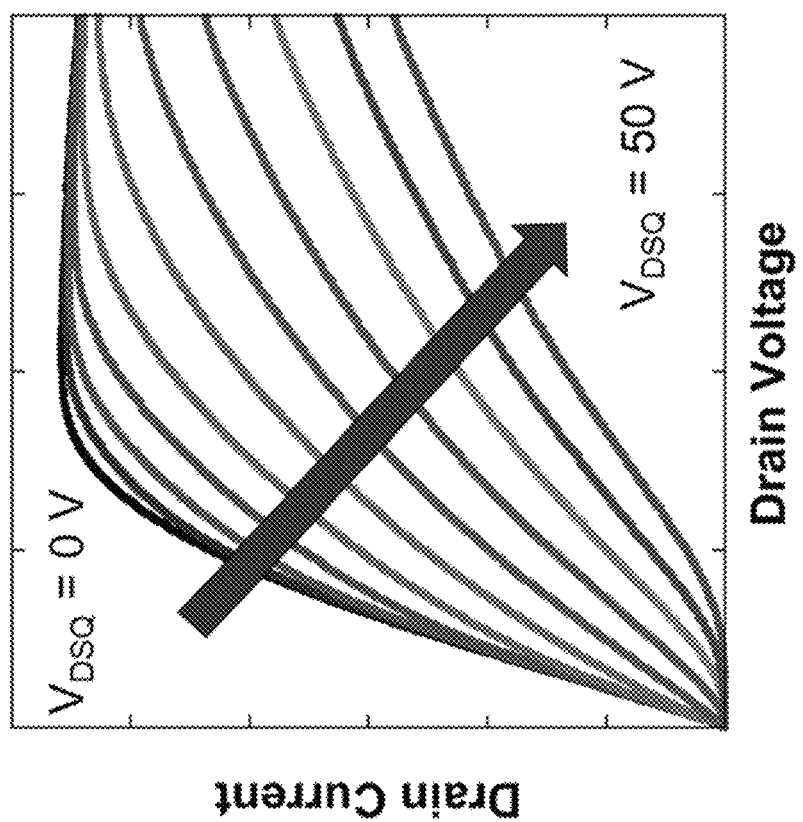

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure. For example, in the description below, specific layer thicknesses may be given, but one skilled in the art will readily recognize that the thicknesses shown are merely exemplary and that other layer thicknesses may be employed as appropriate.

The present invention provides a method for the deposition of plasma-enhanced CVD (PECVD) SiN films for passivation of AlGaN/GaN high electron mobility transistors (HEMTs) without plasma damage to the AlGaN surface from the PECVD process, and further provides passivated HEMTs having no plasma damage to the AlGaN surface.

The present invention suppresses the plasma damage by including a one or more SiN barrier layers deposited on the AlGaN surface. These SiN barrier layers are grown under high frequency (HF) rf conditions that prevent nitrogen (N) ions originating in the nitrogen gas injected into the reaction chamber along with the SiN precursors silane ($SiH_4$) and ammonia ($NH_3$) from having sufficient energy to be accelerated towards the AlGaN surface, where they could cause plasma damage. After the deposition of this thin HF SiN barrier layer, a thick SiN passivation layer is deposited on top of the SiN barrier layer using standard mixed high-frequency/low-frequency (HF/LF) SiN PECVD processing.

The thin HF SiN barrier layers are typically deposited at a high rf frequency of 13.56 MHz, while the HF/LF SiN passivation layers are typically deposited at a high frequency of 13.56 MHz and a low frequency of 100-300 kHz. Deposition of this thin HF SiN barrier layer in accordance with the present invention ensures that the HEMT surface is protected from plasma damage during the subsequent low-stress HF/LF PECVD deposition of the thick SiN passivation layer, thus suppressing the damage to the AlGaN surface and accomplishing the suppression of current collapse.

The deposition process in accordance with the present invention is expected to result in a SiN film with a refractive index close to that of stoichiometric $Si_3N_4$ (1.98-2.01). See Wang et al., supra; see also G. N. Parsons, J. H. Souk, and J. Batey, "Low hydrogen content stoichiometric silicon nitride films deposited by plasma enhanced chemical vapor deposition," *J. Appl. Phys.* 70, 1553 (1991); and H. Huang, K. J. Winchester, A. Suvorova, B. R. Lawn, Y. Liu, X. Z. Hu, J. M. Dell, and L. Faraone, "Effect of deposition conditions on mechanical properties of low-temperature PECVD silicon nitride films," *Mater. Sci. and Engineering* A 435-436 (2006) 453-459. In practice, the film stress, etch rate, and refractive index will vary depending on the specific tool employed. In addition, using a slightly N-rich SiN film (n~1.95) results in improved AlGaN/GaN HEMT electrical performance, most likely due to reduced dangling bond concentration at the III-Nitride surface.

Standard mixed-frequency PECVD SiN deposition processes are typically optimized for low stress and high uniformity in deposition rate and index of refraction across the wafer. A typical PECVD tool such as the Oxford Instruments PlasmaLab 100 used by the inventors at the U.S. Naval Research Laboratory can achieve this by using a high/low frequency plasma process supplied by the manufacturer and optimized on-site for general cleanroom use (300° C., 20 W, 650 mT, 20 sccm $SiH_4$, 23.5 sccm $NH_3$, 980 sccm $N_2$, 13/7 sec. high/low frequency pulsed power (65% ratio), ~12 nm/min dep. rate).

In a first embodiment, the present invention suppresses the damage to the AlGaN surface by inserting a single thin SiN "barrier" film grown by HF plasma deposition after formation of the gate but before the HF/LF plasma deposition of the thick SiN layer, the thin HF layer and the thick HF/LF layer comprising bi-layer SiN passivation on the plasma damage-free AlGaN surface of the HEMT device. This HF SiN barrier film can have a thickness of about 3 to about 20 nm, though optimal performance has been demonstrated using a film having a thickness of about 10 nm.

Figure 3:
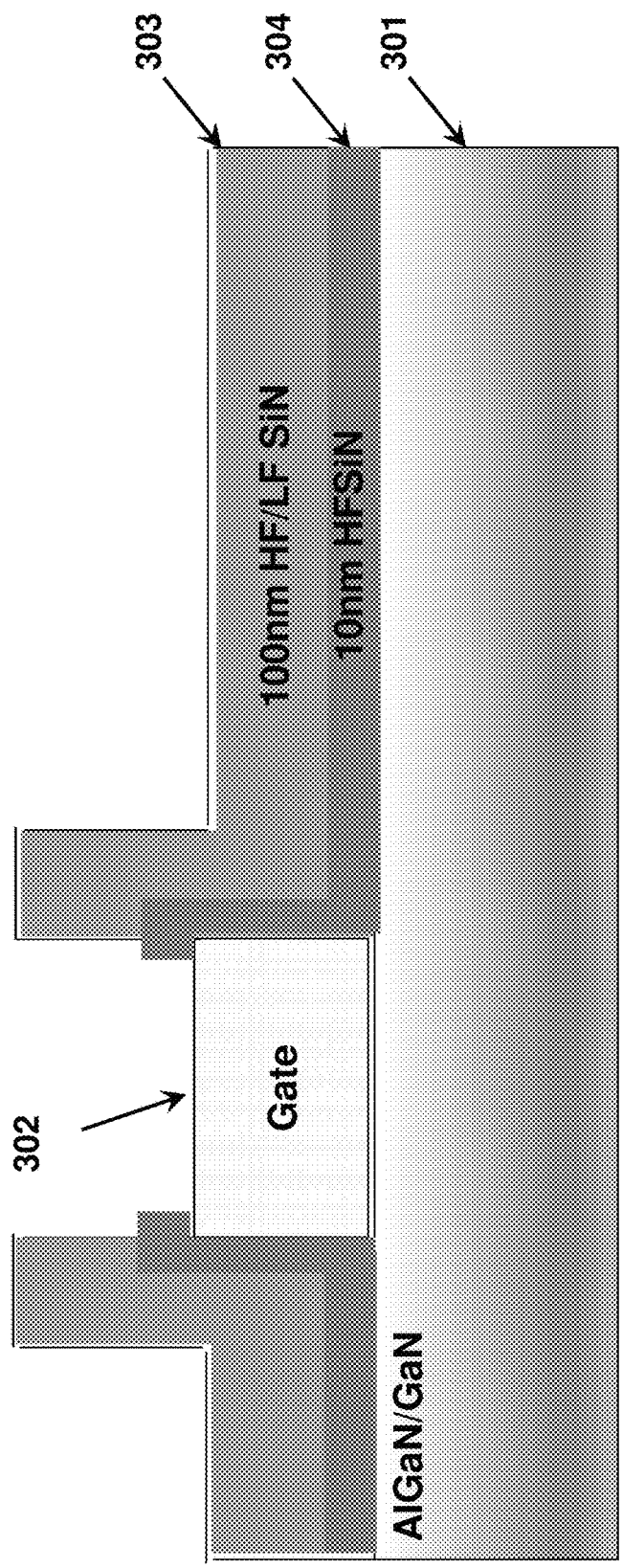
FIG. 3 is a block schematic illustrating aspects of a first embodiment of an HF/LF SiN-passivated HEMT in accordance with the present disclosure.

Thus, as illustrated by the block schematic shown in FIG. 3, an exemplary AlGaN/GaN HEMT having bi-layer SiN passivation in accordance with a first embodiment of present invention includes an AlGaN/GaN heterostructure 301 in which the AlGaN layer is deposited on an upper surface of the GaN layer, a gate 302 formed on an upper surface of the AlGaN/GaN heterostructure 301, and a thick HF/LF SiN passivation layer 303. The thickness of layer 303 (post-gate SiN passivation layer) can be between 20 and 500 nm. A thinner SiN passivation layer will result in increased surface trapping effects from electrons in the channel, and thus poor passivation, while a thicker SiN layer will result in increased capacitances in the device, thus degrading its frequency response. In practice, a 100 nm thick post-gate SiN passivation layer is widely used in the field. In addition, in accordance with the present invention, the structure includes a thin (typically about 10 nm) HF SiN barrier layer 304 deposited on an upper surface of the AlGaN layer and along the sides of the gate before the deposition of HF/LF SiN passivation layer 303 to suppress the plasma damage to the AlGaN surface, HF SiN barrier layer 304 and HF/LF SiN layer 303 together comprising bi-layer SiN passivation on the plasma damage-free AlGaN surface of the HEMT device.

Example 1

HEMTs having bi-layer SiN passivation in accordance with the present invention were prepared and analyzed.

All HEMT samples were fabricated from a 2 nm/17.5 nm/1.8 μm thick GaN/Al$_{0.27}$Ga$_{0.73}$N/GaN wafer on a (111) Si substrate (R$_{SH}$~689 Ω/sq.), grown by metal-organic CVD at Nitronex, Inc. Device isolation regions were defined by a Cl$_2$/Ar inductively coupled plasma (ICP) process (10/5 sccm Cl$_2$/Ar, 5 mTorr, 150 W ICP, 40 W RF, ~60 nm/min for ~100 nm deep mesas). Ohmic contacts with specific contact resistivity ρ$_c$ of 3.25×10$^{-5}$ Ω-cm$^2$ (1.5 Ω-mm) were deposited by e-beam evaporation of 20/120/40/50 nm Ti/Al/Ni/Au and rapid-annealed at 850° C. for 30 s in N$_2$. Probing pads lifted off over the Ohmic contacts consisted of 20/200 nm thick Ti/Au stacks. The Schottky gate contacts consisted of 20/200 nm thick Ni/Au. The SiN passivation process split was then performed (see TABLE 1), followed by a 60 sec. (~100 nm/min) contact opening etch in SF$_6$ ICP plasma. All metallization and dielectric deposition steps were preceded by a cleaning procedure consisting of a 5 min. UV-O$_3$ clean, a 30 sec. 1:10 HCl:H$_2$O dip, and a 30 s buffered HF dip immediately prior to deposition. See D. J. Meyer, J. R. Flemish, and J. M. Redwing, "Plasma Surface Pretreatment Effects on Silicon Nitride Passivation of AlGaN/GaN HEMTs," CS Mantech Conf. Digest, pp. 305, 2007. Measured devices had a gate length of 3 μm, gate-source spacing of 2.5 μm, and a gate-drain spacing of 10 μm in order to maximize the effects of the SiN passivation in the access region.

HEMTs having bi-layer SiN passivation prepared in accordance with the process of the present invention in Samples 1A-1D consisted of 15-180 sec. HF SiN (3-35% of the 510 sec. total growth time) followed by standard HF/LF SiN deposition used in the passivation of the reference HEMT, while Sample 1E was passivated using only HF SiN. The variation in bi-layer SiN thickness resulted from the ~15% faster growth rate for HF SiN, compared to the standard HF/LF SiN process.

Characteristics of SiN-passivated AlGaN/GaN HEMTs according to the prior art and the present invention are summarized in TABLE 1 below.

TABLE 1

| ID  | Total SiN thickness (nm) | Barrier HF SiN growth time (sec.) | HF/LF SiN growth time (sec.) | Refractive index n | E$_G$ (eV) |
|-----|--------------------------|-----------------------------------|------------------------------|--------------------|------------|
| Ref | 100.1                    | 0                                 | 510                          | 1.903              | 4.14       |
| 1A  | 96.1                     | 15                                | 495                          | 1.956              | 4.18       |
| 1B  | 98.6                     | 30                                | 480                          | 1.931              | 4.16       |
| 1C  | 102                      | 60                                | 450                          | 1.903              | 4.05       |
| 1D  | 107.2                    | 180                               | 330                          | 1.890              | 3.99       |
| 1E  | 119.1                    | 510                               | 0                            | 1.889              | 3.63       |

As shown in TABLE 1, samples 1A-1E (grown consecutively) exhibited decreasing refractive index and energy gap, measured by ellipsometry, as the HF SiN content increased.

In contrast, the reference HEMTs (row 1 in TABLE 1) fabricated using the standard SiN deposition process described above exhibited significantly degraded performance, as measured by Hall on a van der Pauw (VdP) structure with active area exposed to the plasma process: R$_{SH}$>1500 Ω/□, μ$_H$=516 cm$^2$/V·s, N$_{SH}$=4.6×10$^{12}$ cm$^{-2}$, as compared to R$_{SH}$=602 Ω/□, μ$_H$=1455 cm$^2$/V·s, N$_{SH}$=7.14×10$^{12}$ cm$^{-2}$ measured on a gated, plasma-protected VdP structure. We note that identically-processed HEMTs on commercial quality AlGaN/GaN exhibited only about 10-15% degradation in Hall mobility; however, degradation in on resistance was still substantial as indicated by step-stress pulsed I-V measurements. See A. D. Koehler, N. Nepal, T. J. Anderson, M. J. Tadjer, K. D. Hobart, C. R. Eddy, Jr., and F. J. Kub, "Atomic Layer Epitaxy AN for Enhanced AlGaN/GaN HEMT Passivation," IEEE Electr. Dev. Lett., Vol. 34, No. 9, pp. 1115-1117 (2012).

In addition, gated VdP structures on samples 1A-1E, on average, exhibited R$_{SH}$=596 Ω/□, μ$_H$=1466 cm$^2$/V·S, N$_{SH}$=7.26×10$^{12}$ cm$^{-2}$, whereas the average Hall parameters on the plasma-exposed VDP's were R$_{SH}$=514 Ω/□, μ$_H$=1333 cm$^2$/V·s, N$_{SH}$=9.22×10$^{12}$ cm$^{-2}$.

FIGS. 4A-4D are plots illustrating aspects of the performance of an HF/LF SiN-passivated HEMT in accordance with the present disclosure.

Figure 4B:
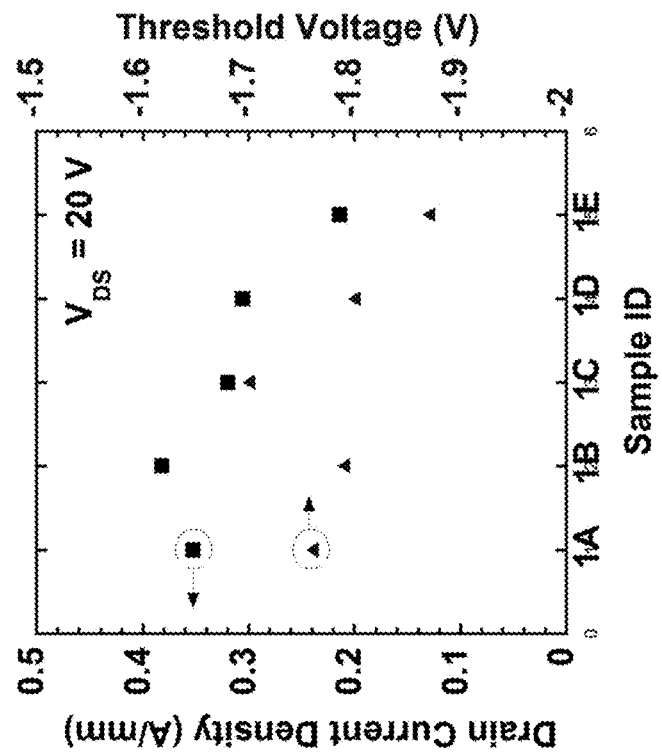
FIGS. 4A-4D are plots illustrating aspects of the performance of an HF/LF SiN-passivated HEMT in accordance with the present disclosure.
Figure 4A:
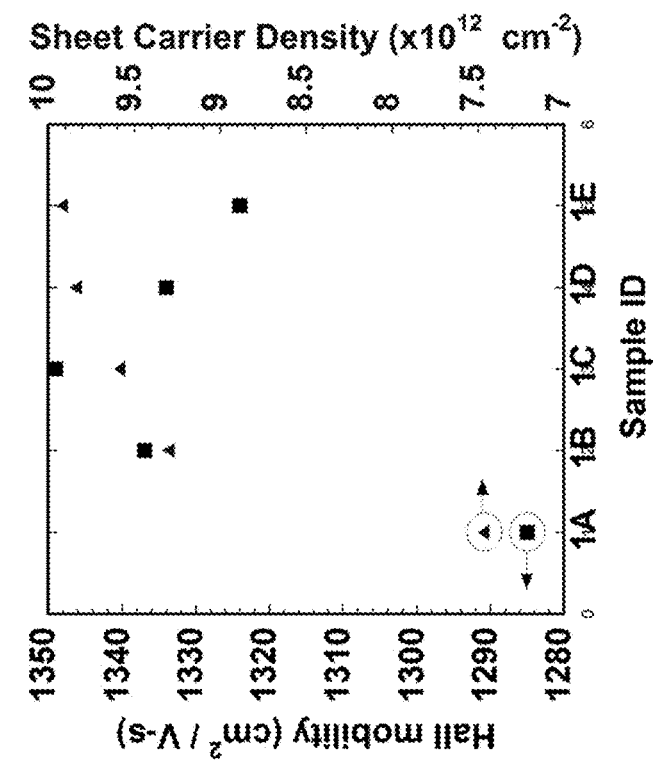

FIG. 4A shows the Hall mobility μ$_H$ (shown by the squares) and sheet carrier density N$_{SH}$ (shown by the triangles) for each of samples 1A-1E. The lowest mobility values were measured for the samples with thinnest (sample 1A) and thickest (sample 1E) HF SiN films, most likely due to LF-plasma induced surface states in the former sample and increased hot electron scattering in the channel for the latter. Thus, a 7-14 nm thick (30-60 sec. deposition) HF SiN was determined as the optimal thickness for a bilayer mixed-frequency PECVD process AlGaN/GaN HEMT passivation.

The stress in the HF SiN films was tensile, as confirmed by the wafer bow of reference Si wafers with 100 nm thick HF SiN, resulting in increased N$_{SH}$, reduced R$_{SH}$, and a negative shift in threshold voltage V$_{TH}$, shown by the plots in FIG. 4B, where saturation drain current density J$_{DS,SAT}$ is shown by the squares and threshold voltage V$_{TH}$ is shown by the triangles.

Figure 4D:
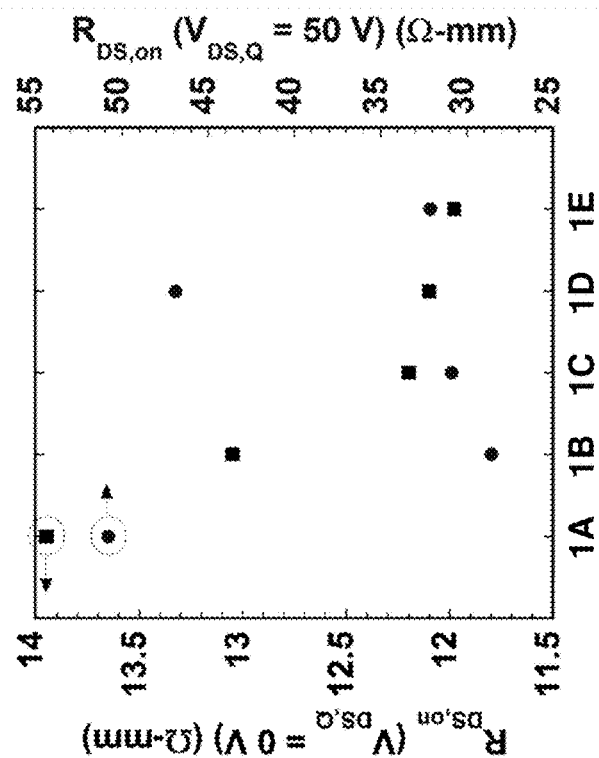
Figure 4C:
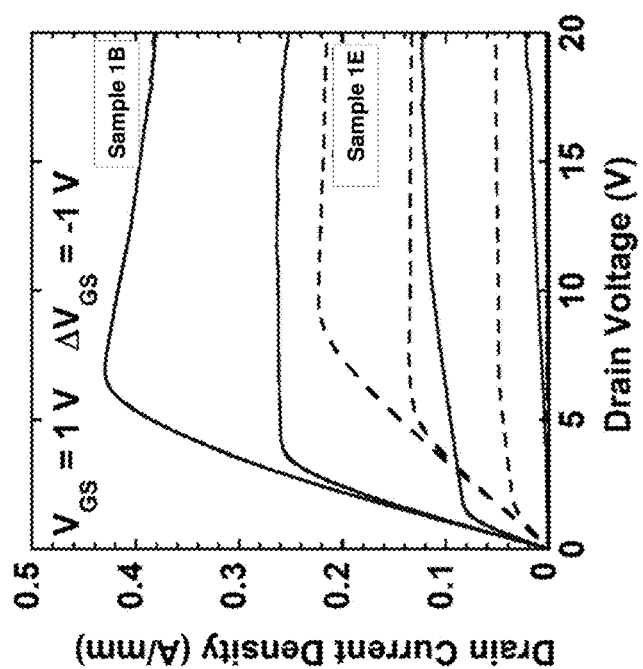

The effect of the bi-layer SiN deposition process in accordance with the present invention is further evident from the plot in FIG. 4C, which presents a comparison in DC output characteristics for samples 1B (14 nm thick HF SiN) and 1E (119 nm thick HF SiN), showing about a factor of 2 higher drain current density (JDs) for sample 1B.

FIG. 4D further presents a comparison of dynamic on resistance (R$_{ON,DYN}$) for each of samples 1A-1E, measured under pulsed IV conditions using an Accent DiVA D265EP analyzer (200 ns on-state pulse width, 1 ms pulse separation, 99.98% duty cycle), where $R_{ON,DYN}$, $V_{DS,Q}=0$ is shown by the squares and $R_{ON,DYN}$, $V_{DS,Q}=50$ is shown by the circles. The reduction in $R_{ON,DYN}$ for 0 V quiescent drain bias correlated well with the increase in $N_{SH}$ as thicker, more tensile HF SiN was grown. However, pulsed measurements after a 50 V quiescent drain bias revealed lowest degradation for sample B, where $R_{ON,DYN}$ increased from 13 Ω-mm to 28.6Ω-mm.

Further research by the inventors has shown that depositing an additional HF SiN barrier layer and annealing this additional layer before formation of the gate to provide tri-layer SiN passivation provides even better performance. The 750° C., 10-minute annealing process in $N_2$ atmosphere improves the SiN film by removing residual Hydrogen and improving its density and stoichiometry.

Thus, in a second embodiment in accordance with the present invention, an additional HF SiN layer is deposited on the upper surface of the AlGaN layer and is annealed before formation of the gate. Following the annealing of this first HF SiN layer, the gate is formed and a second HF SiN layer is deposited, followed by formation of a HF/LF PECVD SiN passivation layer. As with the thin HF SiN layer in the first embodiment, in this embodiment, the annealed first HF SiN layer and the second HF SiN layer suppress plasma damage to the AlGaN surface during the deposition of the thick HF/LF SiN layer, with the annealed first HF SiN layer, the second HF SiN layer, and the HF/LF SiN layer comprising tri-layer SiN passivation on the plasma damage-free AlGaN surface of the HEMT device.

Figure 5:
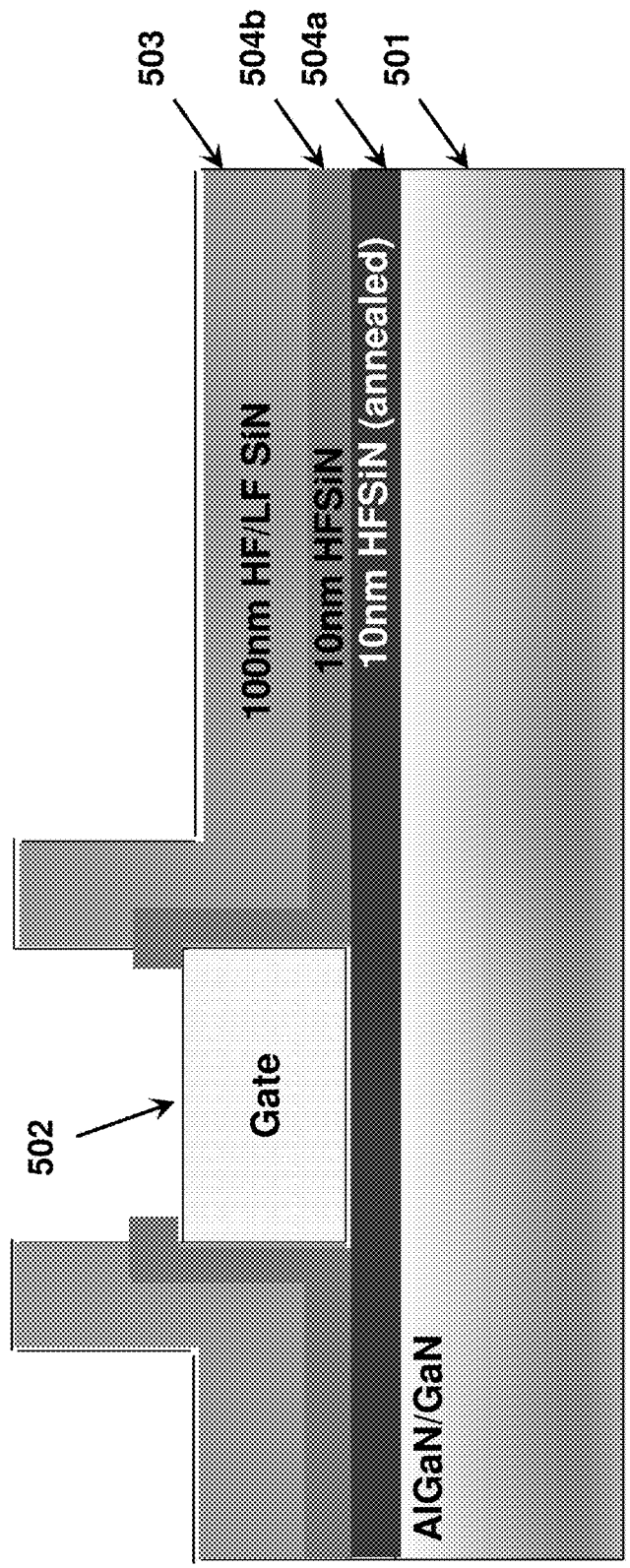
FIG. 5 is a block schematic illustrating aspects of a second embodiment of an HF/LF SiN-passivated HEMT in accordance with the present disclosure.

As illustrated by the block schematic shown in FIG. 5, an exemplary AlGaN/GaN HEMT having tri-layer SiN passivation in accordance with a second embodiment of the present invention includes an AlGaN/GaN heterostructure 501 in which the AlGaN layer is deposited on an upper surface of the GaN layer and a gate 502 formed on an upper surface of the AlGaN/GaN heterostructure 501. The structure further includes a first thin HF SiN barrier layer 504a deposited on the upper surface of the AlGaN layer, before the gate. As described above, this first HF SiN barrier layer is densified by annealing, thus improving its performance as a barrier for LF-plasma energized ions. A second thin HF SiN barrier layer 504b is then deposited on an upper surface of the annealed first HF SiN barrier layer 504a and along the sides of the gate. Finally, a thick HF/LF SiN passivation layer 503 is deposited as described above, the three SiN layers comprising tri-layer SiN passivation on the plasma damage-free AlGaN surface of the HEMT device. As with the first embodiment described above, the HF SiN layers are be deposited at a high rf frequency, typically 13.56 MHz, which prevents the N ions in the reaction chamber from having sufficient energy to be accelerated towards the AlGaN surface where they could cause plasma damage, while the HF/LF SiN layers are typically deposited at a high frequency of 13.56 MHz and a low frequency of 100-300 kHz. The thickness of the deposited HF SiN barrier layers can be from about 5 to about 20 nm, typically about 10 nm, and the thickness of the HF/LF SiN passivation layer can be from about 20 and 500 nm, typically about 100 nm.

Example 2

To demonstrate the advantages of an AlGaN/GaN HEMT having tri-layer SiN passivation in accordance with this embodiment of the present invention, a split-wafer experiment was carried out using commercial AlGaN/GaN material ($R_{SH}$~338 Ω/sq.) grown by MOCVD on a SiC substrate.

In this Example, a combination of a thin (~10 nm) SiN film deposited pre-gate at high frequency (13.56 MHz) to minimize N-ion surface bombardment caused by low frequency ions and a thick, post-gate HF/LF SiN film designed to suppress on-state conductance degradation was used to obtain an optimized tri-layer PECVD SiN film having a total thickness of 122 nm was developed, which maintained mobility, reduced on-resistance, improved drain-source current density, minimized degradation in dynamic on-state conductance upon off-state drain voltage stress, and minimized additional tensile stress.

Characteristics of SiN passivated HEMTs according to the prior art and this second embodiment of the present invention are summarized in TABLES 2 and 3 below.

TABLE 2

| ID | Total SiN thickness (nm) | Pre-Gate HF SiN growth time (sec.) | Post-Gate SiN growth time (sec.) | Refractive index n | $E_G$ (eV) |
|---|---|---|---|---|---|
| Ref | 111.3 | 0 | 510 | 1.903 | 4.14 |
| 2A | 15.8 | 60 | 0 | 1.823 | 3.57 |
| 2B | 10.5 | 60 | 0 | 2.115 | 3.22 |
| 2C | 127.1 | 60 | 510 | 1.994 | 4.08 |
| 2D | 121.8 | 60 | 510 | 1.994 | 4.08 |

TABLE 3

| ID | Sheet Resistance $R_{SH}$ (Ω/sq.) | Contact Resistivity $\rho_c$ (Ω·cm$^2$) | Hall Mobility $M_{HALL}$ (cm$^2$/V·s) | Sheet Carrier Density $N_{SH}$ (×10$^{12}$ cm$^{-2}$) |
|---|---|---|---|---|
| Ref | 314 | 2 × 10$^{-5}$ | 2081 | 9.55 |
| 2A | 317 | 2 × 10$^{-5}$ | 2060 | 9.56 |
| 2B | 334 | 1.3 × 10$^{-5}$ | 2159 | 8.64 |
| 2C | 322 | 2.37 × 10$^{-5}$ | 2021 | 9.59 |
| 2D | 334 | 2.06 × 10$^{-5}$ | 2160 | 8.64 |

Sample 2D consisted of 60 sec. pre-gate HF SiN combined with a 510 sec. post-gate HF/LF SiN film.

$R_{ON,DYN}$ of sample 2D degraded less when compared to that of a similar HEMT, which had a pre-gate SiN film deposited by MOCVD.

The sample split presented in TABLE 2 aimed to minimize the LF-plasma ion damage to the III-Nitride surface by inserting a thin SiN film grown by HF-plasma before the HF/LF plasma process. Thickness and refractive index, measured by ellipsometry, indicated that a reduction in SiN thickness from 15.8 nm to 10.5 nm, as well as an increase in refractive index from 1.823 to 2.115 took place after the 750° C. anneal (TABLE 2), suggesting that densification and partial outgassing occurred in the pre-gate SiN film. The post-gate SiN was 111.3 nm thick and had a refractive index of 1.994 and energy gap of 4.08 eV, as measured on witness Si samples. Thus, samples 2C and 2D had a total SiN passivation thickness of 127.1 nm and 121.8 nm, respectively.

TABLE 3 presents the results of the post-process Hall effect (van der Pauw) and transfer length method (TLM) measurements on the four samples. Lower sheet resistance and higher sheet carrier density were measured for sample 2A, compared to sample 2B. While the as-deposited 15.8 nm thick HF SiN could have induced additional tensile stress on the heterostructure, the 750° C. anneal could have restored the surface potential of the as-grown material by removing any plasma-induced changes to the AlGaN surface chemistry. However, the 750° C. anneal increased Hall effect mobility to 2159 cm$^2$/V-s, and the Hall effect characteristics of samples 2A and 2B were maintained after the thick post-gate SiN passivation (samples 2C and 2D), indicating they were determined by the pre-gate SiN interaction with the AlGaN surface. For comparison, a reference sample from the same wafer which did not receive pre-gate SiN, but only the post-gate SiN process described above, had $R_{SH}$=314 Ω/sq., $\mu_{HALL}$=2081 cm$^2$/V-s, and $N_{SH}$=9.55×10$^{12}$ cm$^{-2}$, consistent with the Hall characteristics of samples 2A and 2C (no SiN anneal).

Figure 6:
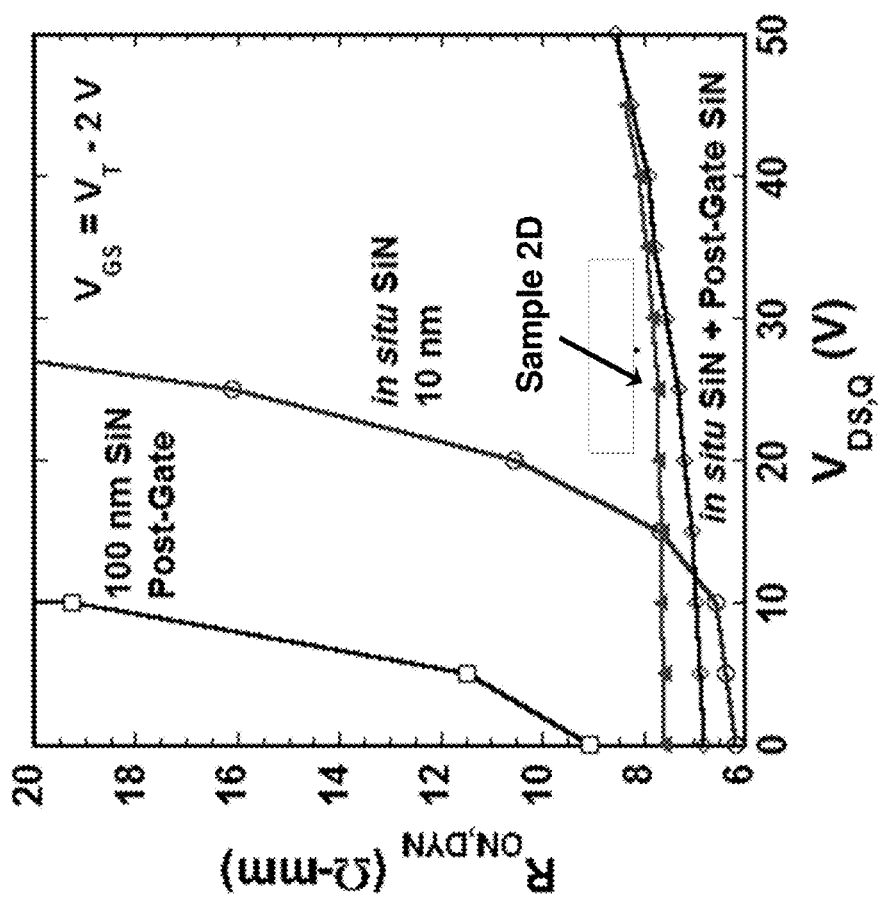
FIG. 6 is a plot illustrating the effect on current collapse of the SiN deposition process in accordance with the present invention.

In addition, the inventors quantified the effect of the SiN deposition process in accordance with the present invention on current collapse by comparing pulsed dynamic on-state resistance ($R_{ON,DYN}$) characteristics as a function of quiescent drain bias. The results are presented in FIG. 6, which shows the results of a comparison of $R_{ON,DYN}$ of HEMTs passivated using either post-gate PECVD SiN only, in situ MOCVD SiN only, a tri-layer SiN combination of pre-gate MOCVD SiN and post-gate PECVD SiN, and sample 2D (tri-layer SiN combination of pre-gate PECVD SiN and post-gate PECVD SiN). It can be observed that the tri-layer PECVD SiN passivation scheme employed in sample 2D resulted in the smallest change in on-state resistance.

Advantages and New Features

The devices in accordance with the present invention improve overall HEMT performance, of which current collapse is one component, with others including but being not limited to gate and drain leakage currents, breakdown voltage, threshold voltage, etc.

Nitrogen ion bombardment of the AlGaN surface during the low frequency plasma deposition cycle portion of the mixed frequency PECVD process is avoided by insertion of a high-frequency PECVD deposited thin SiN barrier layer.

Suppression of current collapse is achieved using standard PECVD equipment, as opposed to more expensive LPCVD or MOCVD growth processes.

The passivation process is performed outside the AlGaN/GaN growth chamber, unlike the in situ growth of MOCVD SiN, avoiding possible Si contamination issues as Si is a donor in III-Nitrides such as GaN.

MOCVD SiN growth and etch rates are much lower, making this material harder to grow and devices comprising this material harder to process.

Due to the slow growth rate of MOCVD SiN, a combination of a thin MOCVD SiN layer and a thick PECVD SiN layer is standardly employed, making PECVD SiN readily available anyway.

Alternatives

In some cases the thin SiN barrier layer may be deposited at the same time as the thick SiN passivation layer, while in other cases, it can be deposited prior to deposition of the thick layer.

In some cases, additional SiN barrier layers may or may not be already present in the AlGaN/GaN heterostructure (e.g., an MOCVD SiN layer can be present prior to the deposition of the PECVD SiN barrier layer).

In some embodiments, additional surface pretreatments may be employed prior to the deposition of the thin HF SiN barrier layer or the thick HF/LF SiN passivation layer, while in other embodiments, additional treatments such as annealing after both SiN layers are deposited may or may not be performed.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A passivated high-electron mobility transistor (HEMT) device, comprising:
   an AlGaN/GaN heterostructure having an AlGaN layer disposed on an upper surface of a GaN layer;
   a gate formed on an upper surface of the AlGaN layer;
   a thin HF SiN layer deposited by high-frequency plasma-enhanced chemical vapor deposition (HF PECVD) on the upper surface of the AlGaN layer and along the sides of the gate, the thin HF SiN layer being annealed to densify the thin HF SiN layer and improve its performance as a barrier to plasma damage on the upper surface of the AlGaN layer; and
   a thick HF/LF SiN layer deposited by high-frequency/low-frequency plasma-enhanced chemical vapor deposition (HF/LF PECVD) on an upper surface of the annealed thin HF SiN layer;
   the annealed thin HF SiN layer and the thick HF/LF SiN layer comprising bi-layer SiN passivation on the upper surface of the AlGaN layer of the HEMT device;
   wherein the HF PECVD deposition of the thin HF SiN layer prevents plasma damage to the upper surface of the AlGaN layer from nitrogen ions during the deposition of the thin HF SiN layer; and
   wherein the annealed thin HF SiN layer prevents damage to the upper surface of the AlGaN layer during a low-frequency plasma deposition cycle of the thick HF/LF SiN layer deposition.

2. The passivated HEMT device according to claim 1, wherein the thin HF SiN layer is deposited at a high rf frequency of 13.56 MHz and the thick HF/LF SiN layer is deposited at a high rf frequency of 13.56 MHz and a low frequency of 100-300 kHz.

3. The passivated HEMT device according to claim 1, wherein the thin HF SiN layer has a thickness of 3 to 20 nm.

4. The passivated HEMT device according to claim 1, wherein the thin HF SiN layer has a thickness of 10 nm.

5. The passivated HEMT device according to claim 1, wherein the thin HF/LF SiN layer has a thickness of 20 to 500 nm.

6. The passivated HEMT device according to claim 1, wherein the thick HF/LF SiN layer has a thickness of 100 nm.

7. A passivated high-electron mobility transistor (HEMT) device, comprising:
   an AlGaN/GaN heterostructure having an AlGaN layer disposed on an upper surface of a GaN layer;
   a first thin HF SiN layer deposited by high-frequency plasma-enhanced chemical vapor deposition (HF PECVD) on the upper surface of the AlGaN layer, the first thin HF SiN layer being annealed to density the first thin HF SiN layer and improve its performance as a barrier to plasma damage on the upper surface of the AlGaN layer;
   a gate formed directly on a first area of an upper surface of the annealed first thin HF SiN layer;

a second thin HF SiN layer deposited by HF PECVD directly on the upper surface of the annealed first thin HF SiN layer and along the sides of the gate; and a thick HF/LF SiN layer deposited by high-frequency/low-frequency plasma-enhanced chemical vapor deposition (HF/LF PECVD) directly on an upper surface of the second thin HF SiN layer;

the annealed first thin HF SiN layer, the second thin HF SiN layer, and the thick HF/LF SiN layer comprising tri-layer SiN passivation on the upper surface of the AlGaN layer of the HEMT device;

wherein the HF PECVD deposition of the first and second thin HF SiN layers prevents plasma damage to the upper surface of the AlGaN layer from nitrogen ions during the deposition of the first and second thin HF SiN layers; and wherein the first and second thin HF SiN layers prevent damage to the upper surface of the AlGaN layer during a low-frequency plasma deposition cycle of the thick HF/LF SiN layer deposition.

8. The passivated HEMT device according to claim 7, wherein the first and second thin HF SiN layers are deposited at a high rf frequency of 13.56 MHz and the thick HF/LF SiN layer is deposited at a high rf frequency of 13.56 MHz and a low frequency of 100-300 kHz.

9. The passivated HEMT device according to claim 7, wherein at least one of the first and second thin HF SiN layers has a thickness of 3-20 nm.

10. The passivated HEMT device according to claim 7, wherein at least one of the first and second thin HF SiN layers has a thickness of 10nm.

11. The passivated HEMT device according to claim 7, wherein the thick HF/LF SiN layer has a thickness of 20-500 nm.

12. The passivated HEMT device according to claim 7, wherein the thick HF/LF SiN layer has a thickness of 100 nm.

13. The device according to claim 7, wherein the second thin HF SiN layer is annealed at 750° C. for 10 minutes.

14. A method for forming a passivated AlGaN/GaN high electron mobility transistor (HEMT) device, comprising:

depositing an AlGaN barrier layer on an upper surface of a GaN channel/buffer layer;

forming a gate on an upper surface of the AlGaN barrier layer;

depositing a thin HF SiN layer by means of high-frequency plasma-enhanced chemical vapor deposition (HF PECVD) directly on the upper surface of the AlGaN barrier layer and along the sides of the gate;

annealing the thin HF SiN layer to densify the thin HF SiN layer and improve its performance as a barrier to plasma damage on the upper surface of the AlGaN barrier layer; and depositing a thick HF/LF SiN layer by means of high-frequency/low-frequency plasma-enhanced chemical vapor deposition (HF/LF PECVD) on the annealed thin HF SiN layer;

the annealed thin HF SiN layer and the thick HF/LF SiN layer comprising bi-layer SiN passivation on the upper surface of the AlGaN barrier layer of the HEMT device;

wherein the HF PECVD deposition of the thin HF SiN layer prevents plasma damage to the upper surface of the AlGaN barrier layer from nitrogen ions during the deposition of the thin HF SiN layer; and wherein the annealed thin HF SiN layer prevents damage to the upper surface of the AlGaN barrier layer during a low-frequency plasma deposition cycle of the thick HF/LF SiN layer deposition.

15. The method according to claim 14, wherein the thin HF SiN layer is deposited at an rf frequency of 13.56 MHz and the thick HF/LF SiN layer is deposited at a high rf frequency of 13.56 MHz and a low frequency of 100-300 kHz.

16. The method according to claim 14, wherein the thin HF SiN layer has a thickness of 3-20 nm.

17. The method according to claim 14, wherein the thin HF SiN layer has a thickness of 10 nm.

18. The method according to claim 14, wherein the thick HF/LF SiN layer has a thickness of 20-500 nm.

19. The method according to claim 14, wherein the thick HF/LF SiN layer has a thickness of 100 nm.

20. A method for forming a passivated AlGaN/GaN high electron mobility transistor (HEMT) device, comprising:

depositing an AlGaN barrier layer on an upper surface of a GaN channel/buffer layer;

depositing a first thin HF SiN layer directly on an upper surface of the AlGaN barrier layer by means of high-frequency plasma-enhanced chemical vapor deposition (HF PECVD);

annealing the first thin HF SiN layer to densify the first thin HF SiN layer and improve its performance as a barrier to plasma damage on the upper surface of the AlGaN barrier layer;

forming a gate directly on a first area of an upper surface of the annealed first thin HF SiN layer;

depositing a second thin HF SiN layer by means of high-frequency plasma-enhanced deposition (HF/LF PECVD) directly on a second area of the upper surface of the annealed first thin HF SiN layer and on the sides of the gate; and depositing a thick HF/LF SiN layer by means of high frequency/low-frequency plasma-enhanced chemical vapor deposition (HF/LF PECVD) directly on an upper surface of the second thin HF SiN layer;

the first and second thin HF SiN layers and the thick HF/LF SiN layer comprising tri-layer SiN passivation on the upper surface of the AlGaN barrier layer of the HEMT device;

wherein the HF PECVD deposition of the first and second thin HF SiN layers prevents plasma damage to the upper surface of the AlGaN barrier layer from nitrogen ions during the deposition of the first and second thin HF SiN layers; and wherein the first and second thin HF SiN layers prevent damage to the upper surface of the AlGaN barrier layer during a low-frequency plasma deposition cycle of the thick HF/LF SiN layer deposition.

21. The method according to claim 20, wherein the first and second thin HF SiN layers are deposited at an rf frequency of 13.56 MHz and the thick HF/LF SiN layer is deposited at a high rf frequency of 13.56 MHz and a low frequency of 100-300 kHz.

22. The method according to claim 20, wherein the first thin HF SiN layer has a thickness of 3-20 nm.

23. The method according to claim 20, wherein the second thin HF SiN layer has a thickness of 3-20 nm.

24. The method according to claim 20, wherein each of the first and second thin HF SiN layers has a thickness of 10 nm.

25. The method according to claim 20, wherein the thick HF/LF SiN layer has a thickness of 20-500 nm.

26. The method according to claim 20, wherein the thick HF/LF SiN layer has a thickness of 100 nm.

27. The method according to claim 20, wherein the second thin HF SiN layer is annealed at 750° C. for 10 minutes.

* * * * *